United States Patent

Schneider et al.

[11] Patent Number: 6,065,531
[45] Date of Patent: May 23, 2000

[54] AIR WATER-HEAT EXCHANGER FOR A SWITCHGEAR CABINET

[75] Inventors: Stefan Schneider, Bad Endbach; Adam Pawlowski, Eschenburg-Wissenbach, both of Germany

[73] Assignee: Rittal-Werk Rudolf Loh GmbH, Herborn, Germany

[21] Appl. No.: 09/051,008

[22] PCT Filed: Oct. 22, 1996

[86] PCT No.: PCT/EP96/04578

§ 371 Date: Mar. 30, 1998

§ 102(e) Date: Mar. 30, 1998

[87] PCT Pub. No.: WO97/16949

PCT Pub. Date: May 9, 1997

[30] Foreign Application Priority Data

Oct. 28, 1995 [DE] Germany ............................ 195 40 297

[51] Int. Cl.[7] .................................................. F24H 3/06
[52] U.S. Cl. .............................. 165/122; 165/53; 62/285
[58] Field of Search .............................. 165/53, 55, 122, 165/57; 62/285

[56] References Cited

U.S. PATENT DOCUMENTS

| | | | |
|---|---|---|---|
| 1,758,643 | 5/1930 | Baetz ........................................ | 165/122 |
| 2,852,235 | 9/1958 | Mcelgin et al. ........................... | 165/55 |
| 2,983,484 | 5/1961 | Wood ....................................... | 165/122 |
| 3,129,753 | 4/1964 | Davis et al. ............................... | 165/55 |
| 3,403,725 | 10/1968 | Miner ...................................... | 165/122 |
| 3,653,431 | 4/1972 | Loveley .................................... | 165/53 |
| 3,831,669 | 8/1974 | Menne et al. ............................. | 165/122 |
| 3,842,903 | 10/1974 | Rubinstein ............................... | 165/122 |
| 4,076,073 | 2/1978 | Yamamoto et al. ........................ | 165/53 |
| 4,386,651 | 6/1983 | Reinhard .............................. | 165/104.33 |
| 4,416,327 | 11/1983 | Nakada et al. ............................ | 165/122 |
| 4,854,375 | 8/1989 | Farina et al. ............................... | 165/53 |
| 5,060,717 | 10/1991 | Morita et al. ............................ | 165/122 |
| 5,090,476 | 2/1992 | Immel ...................................... | 165/122 |

*Primary Examiner*—Ira S. Lazarus
*Assistant Examiner*—Terrell McKinnon
*Attorney, Agent, or Firm*—Jansson, Shupe, Bridge & Munger, Ltd.

[57] ABSTRACT

An improvement to an air-water heat exchanger having an exchanger unit and a blower that are located in a housing constructed of a shell surrounded by a hood that is connected to a cabinet wall where the cabinet wall and the floor of the shell include openings and the housing is divided by at least one separating wall into an inlet chamber and an outlet chamber that connect to the openings in the floor of the shell. The improvement involves a blower, having an air outlet, that is located in the inlet chamber of the heat exchanger in such a manner so as to draw air through an air suction opening in the floor of the shell, and then supply that air through an opening in the separating wall to the exchanger unit located in the outlet chamber where the air is cooled and then directed by a drip separator and a baffle plate toward the associated air outlet opening in the floor of the shell.

8 Claims, 2 Drawing Sheets

AIR WATER-HEAT EXCHANGER FOR A SWITCHGEAR CABINET

FIELD OF THE INVENTION

The invention relates generally to an air-water heat exchanger and, more particularly, to an air-water heat exchanger with an exchanger unit and a blower which are lodged in a housing attached to switch cabinet.

BACKGROUND OF THE INVENTION

An air-water-heat exchanger of this type is known from DE 40 08 838 C1. The exchanger unit in this known air-water heat exchanger is located in the inlet chamber and the blower is located in the outlet chamber.

OBJECTS OF THE INVENTION

It is an object of this invention to provide an improved air-water heat exchanger that overcomes some of the problems and shortcomings of devices of the prior art.

Another object of this invention is to provide an improved air-water heat exchanger that results in a more efficient transfer of air over the heat exchanger.

How these and other objects are accomplished will become apparent from the following descriptions and from the drawings.

SUMMARY OF THE INVENTION

The invention involves an improvement to an air-water heat exchanger having an exchanger unit and a blower that are located in a housing constructed of a shell surrounded by a hood that is connected to a cabinet wall where the cabinet wall and the floor of the shell include openings and the housing is divided by at least one separating wall into an inlet chamber and an outlet chamber that connect to the openings in the floor of the shell. The improvement comprises a blower, having an air outlet, that is located in the inlet chamber of the heat exchanger in such a manner so as to draw air through an air suction opening in the floor of the shell, and then supply that air through an opening in the separating wall to the exchanger unit located in the outlet chamber where the air is cooled and then directed by a drip separator and a baffle plate toward the associated air outlet opening in the floor of the shell.

As a result of the altered air path an overpressure is generated before the exchanger unit. Improved air impaction as compared to the known low pressure embodiment is thereby achieved on the lamellar packet of the exchanger unit with relatively little clearances between the exchanger unit and the blower.

Moreover, as a result of the altered air path a speed variation of the air occurs along the heat exchanger i.e., the air that leaves the heat exchanger has a considerably lower speed as compared to previous air paths. The condensation water drops that form in the heat exchanger can thus drop down to the shell much more readily under the effect of the force of gravity, in order to be led off to the outside by means of the condensation water drainage. The risk of water drops traveling out of the heat exchanger is much slighter in this case, with equivalent blowers, than with previous air paths, since the altered air path permits the condensation water or leakage water to collect on the overpressure side. The direction of drainage thus corresponds to the direction of the air flow. The use of felt in order to, as was previously done, drain off condensation water against the flow of air to the outside is therefore no longer required.

In one embodiment of the invention, baffles or guide plates in the inlet chamber can be eliminated in that the blower draws air axially and expels it through a tangentially directed air outlet that is connected to the separation wall.

In a preferred embodiment of the invention, the separation wall is slightly inclined toward the side with the air outlet opening and the exchanger unit is positioned perpendicular to the separating wall at a distance from the floor of the shell that permits the opening in the separating wall to remain free. This embodiment allows the air drawn through the opening to be guided in a simple manner from the bottom to the top over the exchanger unit.

In yet another embodiment of the invention, the floor under the exchanger unit slants downward in the direction toward the air outlet opening and a condensed water drain is located in the shell next to the air outlet opening. Such embodiment allows the shell to be employed as a collection shell for condensation water.

In order that the condensation water collected in the shell drain into the switch cabinet, still another embodiment provides that the air suction opening and the air outlet opening are surrounded by bordering walls that project above the floor of the shell.

The braking action of the drip separator and the passage of condensation water or leakage water is, in another embodiment, increased or diminished in that the drip separator is constructed as a wire cloth drip separator with an upper side, that is the outlet side, that covers a majority of the surface of the exchanger unit.

In still another version of the embodiment, the complete division of the space surrounded by the shell and the hood is achieved in that the shell is divided by a separation cross piece that is adjoined with the separation wall thereby dividing the space enclosed by the hood into inlet and outlet chambers.

DETAILED DESCRIPTIONS OF THE PREFERRED EMBODIMENTS

Figure 1:
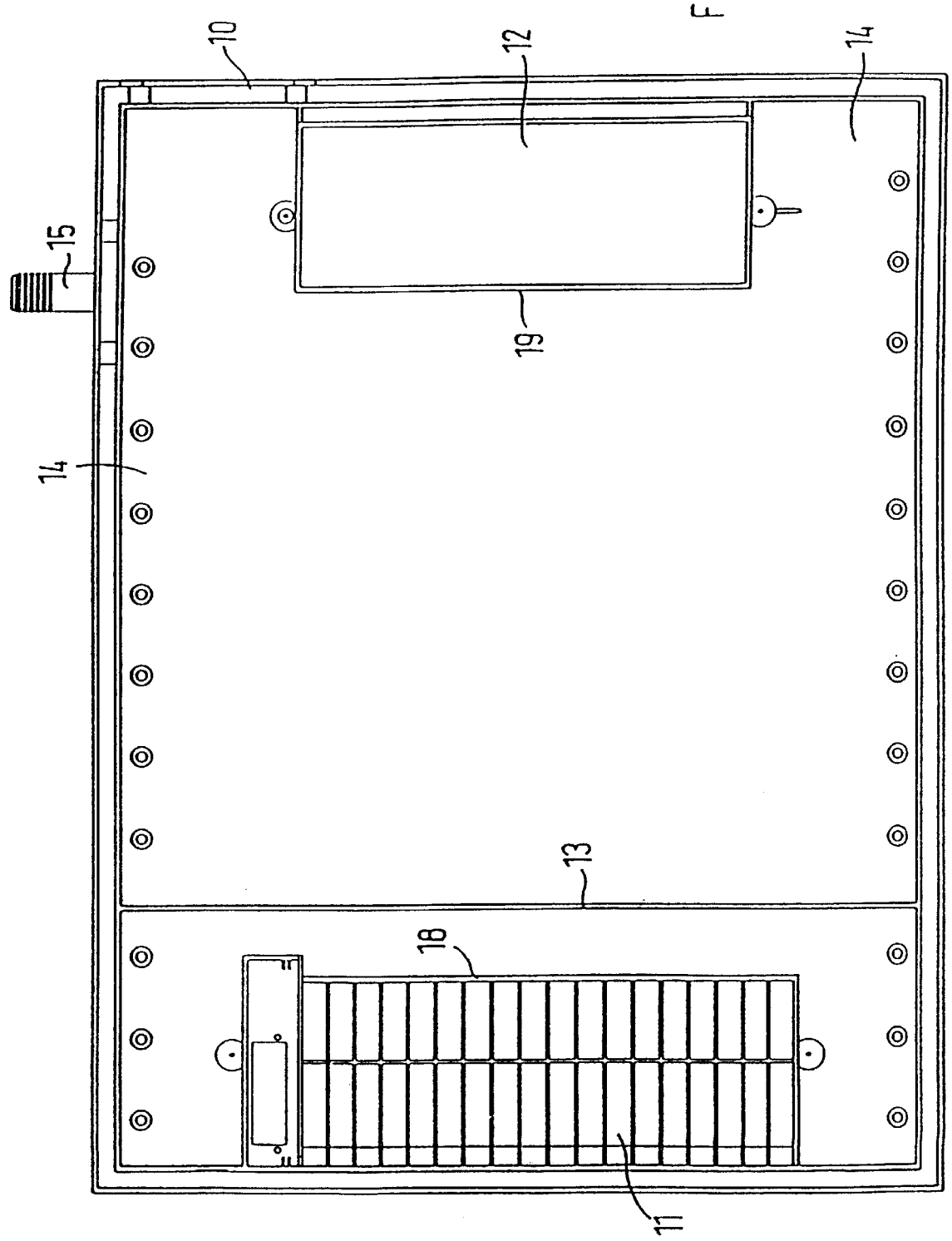
FIG. 1 is a top view the shell of the air-water heat exchanger that is connected to the covering wall of the switch cabinet.
Figure 2:
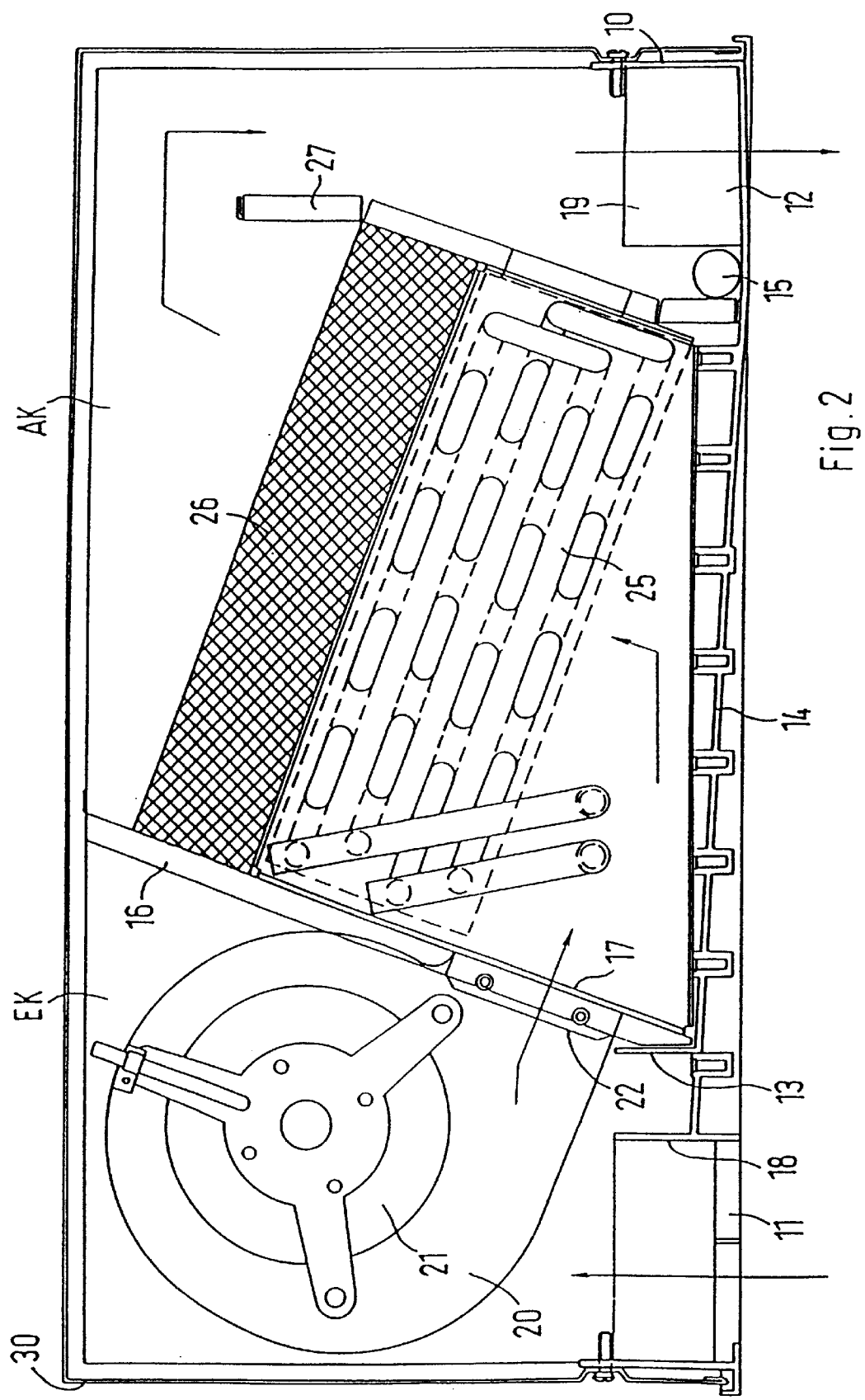
FIG. 2 is a schematic lateral view of the air-water heat exchanger, illustrating the inner structure of the exchanger.

The shell 10 illustrated in FIG. 1 features a circumferential double border that forms a receptacle for the hood. The shell space is subdivided by a separation wall 13 formed on the floor 14, whereby the smaller space is provided with an air suction opening 11 constructed like a screen with cross pieces. In the larger space there is an air outlet opening 12 in the floor 14 of the shell 10. In on embodiment of the invention, the air suction opening 11 and the air outlet opening 12 are rectangularly shaped and arranged in the area of the narrow side of the rectangular shell 10. Bordering walls 18 and 19 surround the air suction opening 11 and the air outlet opening 12, so that condensation water collected by the shell 10 can not flow back into the switch cabinet, but instead can drain from the shell 10 by means of the condensation water drain formed in the area of the air outlet opening 12. The floor 14 of the shell 10 is thereby designed so as to fall in the direction of the air outlet opening 12, as can be seen in FIG. 2.

A separating wall 16 that is inclined toward the air outlet opening 12 adjoins the separating cross piece 13 of the shell 10 and subdivides the housing space surrounded by the hood 30 and the shell 10 into an inlet chamber EK (IC) and an outlet chamber AK (OC). A blower 20 is lodged in the inlet chamber EK (IC) and draws air axially and expels it by means of a blower outlet 22. The axial suction opening 21 of the blower 20 is connected to the inner space of the switch cabinet by means of an air suction opening 11 when the air-water heat exchanger is fastened to the covering wall of the switch cabinet and the covering wall is provided with corresponding openings, which can overlap with the air suction opening 11 and the air outlet opening 12.

The air outlet 22 of the blower 20 is constructed as a collar piece and is connected to the separating wall 16 that is provided with a suitable opening 17 at the point of the connection. This opening 17 permits the connection of the exchanger unit 25 in the outlet chamber AK (OC) to the separating wall 13. This exchanger unit 25 contains the cooling liquid in lines, flowing through the coils of the exchanger unit 25. The air supplied by the blower through the opening 17 in the separating wall 16 is supplied to the outlet chamber AK (OC) by means of the space that remains free under the exchanger unit 25 and passes the exchanger unit 25 from bottom to top through the channels formed in the exchanger unit 25. The outlet side of the exchanger unit 25 is at the top and is covered to a large extent by means of a drip separator 26 constructed as a wire cloth drip separator, so that the condensation water or leakage water formed and possibly carried along with the air flow passing the exchanger unit 25 is held back. Under the exchanger unit 25 the collected water is supplied to the condensation water drain 15 by means of the floor 14 that is inclined toward the air outlet opening 12. The cooled air leaving the exchanger unit 25 is supplied to a type of channel of the air outlet opening 12 by means of the baffle plate 27 that serves as a means of attachment for the exchanger unit 25, and reaches the inner space of the switch cabinet by means of this.

The exchanger unit 25 can additionally also be fastened to the floor 14 of the shell 10, which is provided with screw collets that are molded on.

This subdivision of the air-water heat exchanger permits the predominance the higher pressure in the outlet chamber AK (OC) in the reserve space under the exchanger unit. This results in the effect that the air path and the drainage of condensation water or leakage water is improved.

While the principles of this invention have been described in connection with specific embodiments, it should be understood clearly that these descriptions are made only by way of example and are not intended to limit the scope of the invention.

What is claimed is:

1. In an improved air-water heat exchanger having an exchanger unit and a blower located in a housing constructed of a shell surrounded by a hood that is connected to a cabinet wall where the cabinet wall and the floor of the shell include openings and the housing is divided by at least one separating wall into an inlet chamber having an air inlet and an outlet chamber having an air outlet that connect the openings in the floor of the shell, the improvement comprised of:

an opening in the separating wall;

the blower having an air outlet, which is located in the inlet chamber in such a way so at to draw the air through the air inlet in the floor of the shell and then supply that air, through the opening in the separating wall, to the heat exchanger unit located completely within the outlet chamber in such a manner that the air is drawn upward through the heat exchanger;

a drip separator positioned within the outlet chamber and covering a top portion of the heat exchanger and;

a baffle plate attached to the exchanger, whereby water carried by the air drawn through the heat exchanger is prevented from flowing through the air outlet in the outlet chamber.

2. The improved air-water heat exchanger of claim 1 wherein the openings in the cabinet wall and the floor of the shell overlap.

3. The improved air-water heat exchanger of claim 1 wherein the blower draws air axially and expels it through a tangentially directed air outlet which is connected to the separating wall.

4. The improved air-water heat exchanger of claim 1 wherein:

the separating wall is slightly inclined toward the air outlet opening; and the exchanger unit is positioned perpendicular to the separating wall at a distance from the floor of the shell that permits the opening in the separating wall to remain free.

5. The improved air-water heat exchanger of claim 1 wherein:

the floor under the exchanger unit is constructed so as to slant in the direction of the air outlet opening; and a condensed water drain is located in the shell next to the air outlet opening.

6. The improved air-water heat exchanger of claim 1 wherein the air suction opening and the air outlet opening are surrounded by bordering walls that project above the floor of the shell.

7. The improved air-water heat exchanger of claim 1 wherein the drip separator is constructed as a wire cloth drip separator having an upper side that covers a majority of the exchanger unit.

8. The improved air-water heat exchanger of claim 1 wherein the shell is subdivided by means of a separation cross piece that is adjoined by the separating wall in such a manner so as to subdivide a space surrounded by the hood into the inlet and outlet chambers.

* * * * *